(12) United States Patent
Chen et al.

(10) Patent No.: US 11,342,377 B2
(45) Date of Patent: May 24, 2022

(54) MICRO LIGHT-EMITTING DIODE DISPLAY

(71) Applicant: PlayNitride Display Co., Ltd., MiaoLi County (TW)

(72) Inventors: Yen-Yeh Chen, MiaoLi County (TW); Chih-Ling Wu, MiaoLi County (TW); Kuo-Wei Chen, MiaoLi County (TW)

(73) Assignee: PlayNitride Display Co., Ltd., MiaoLi County (TW)

( * ) Notice: Subject to any disclaimer, the term of this patent is extended or adjusted under 35 U.S.C. 154(b) by 0 days.

(21) Appl. No.: 17/106,168

(22) Filed: Nov. 29, 2020

(65) Prior Publication Data

US 2022/0130890 A1 Apr. 28, 2022

(30) Foreign Application Priority Data

Oct. 26, 2020 (TW) .................................. 109137076

(51) Int. Cl.
*H01L 27/15* (2006.01)
*H01L 25/065* (2006.01)
*H01L 25/18* (2006.01)

(52) U.S. Cl.
CPC ........ *H01L 27/156* (2013.01); *H01L 25/0655* (2013.01); *H01L 25/18* (2013.01)

(58) Field of Classification Search
CPC .... H01L 27/156; H01L 25/0655; H01L 25/18
See application file for complete search history.

(56) References Cited

FOREIGN PATENT DOCUMENTS

| TW | 201807840 | 3/2018 |
| TW | 201906200 | 2/2019 |
| TW | I707491 | 10/2020 |

OTHER PUBLICATIONS

"Office Action of Taiwan Counterpart Application", dated Apr. 23, 2021, p. 1-p. 3.

*Primary Examiner* — Elias Ullah
(74) *Attorney, Agent, or Firm* — JCIPRNET

(57) ABSTRACT

A micro light-emitting diode display, including at least one first type semiconductor base layer, a plurality of semiconductor light-emitting mesas, and a conducting layer, is provided. The plurality of semiconductor light-emitting mesas are dispersedly disposed on the at least one first type semiconductor base layer. The at least one first type semiconductor base layer has a surface exposed by the semiconductor light-emitting mesas. The conducting layer is disposed on the surface of the at least one first type semiconductor base layer and is in an interlaced distribution configuration with the semiconductor light-emitting mesas. The ratio of the area of the conducting layer in contact with the surface to the area of the surface is greater than or equal to 0.2.

15 Claims, 6 Drawing Sheets

US 11,342,377 B2

MICRO LIGHT-EMITTING DIODE DISPLAY

CROSS-REFERENCE TO RELATED APPLICATION

This application claims the priority benefit of Taiwan application serial no. 109137076, filed on Oct. 26, 2020. The entirety of the above-mentioned patent application is hereby incorporated by reference herein and made a part of this specification.

BACKGROUND

Technical Field

This disclosure relates to a display, and in particular to a micro light-emitting diode (micro-LED) display.

Description of Related Art

With the advancement of optoelectronic technology, the volumes of many optoelectronic elements have been moving towards miniaturization gradually. In recent years, due to breakthroughs in the manufacturing dimensions, light-emitting diodes (LEDs) are not only applied to lighting technology, but are also applied to the manufacturing of display panels. A light-emitting diode display is an active light-emitting display. As compared with an organic light-emitting diode (OLED) display, the light-emitting diode display is more energy-efficient, has better contrast performance and has screen visibility in sunlight. In addition, since the light-emitting diode display uses an inorganic material, it has better reliability and a longer service lifespan as compared with the organic light-emitting diode display.

In the light-emitting diode display, micro light-emitting diodes (micro-LEDs), whose sizes have been reduced to the micron level, are arranged in an array. A first type semiconductor base layer may serve as a common electrode between the different micro-LEDs, and the first type semiconductor base layer is electrically connected to a corresponding electrode on a circuit substrate (such as a TFT display substrate). However, the resistance value of the semiconductor is high. The micro-LEDs that are closer to the above corresponding electrode have more electron-hole pairs as compared with the micro-LEDs that are farther away from the above corresponding electrode. The luminous brightness of the micro-LEDs that are closer to the above corresponding electrode is higher than the luminous brightness of the micro-LEDs that are farther away from the above corresponding electrode as the micro-LEDs that are closer to the above corresponding electrode have more electron-hole pairs for recombination, causing the brightness of the micro-LED display to be uneven.

SUMMARY

This disclosure provides a micro-LED display with a uniform luminous brightness.

According to an embodiment of the disclosure, a micro-LED display, including at least one first type semiconductor base layer, a plurality of semiconductor light-emitting mesas, and a conducting layer, is provided. The plurality of semiconductor light-emitting mesas are dispersedly disposed on the at least one first type semiconductor base layer. The at least one first type semiconductor base layer has a surface exposed by the semiconductor light-emitting mesas. The conducting layer is disposed on the surface of the at least one first type semiconductor base layer and is in an interlaced distribution configuration with the semiconductor light-emitting mesas. The ratio of the area of the conducting layer in contact with the surface to the area of the surface is greater than or equal to 0.2.

Based on the above, in the micro-LED display provided by the embodiment of the disclosure, the conductive layer is in contact with the at least one first type semiconductor base layer and the conductive layer serves as a common electrode. This allows the micro-LED to utilize the characteristic that the resistance of the conductive layer is less than the resistance of the at least one first type semiconductor base layer, therefore causing the different micro-LEDS to not have inconsistent numbers of electron-hole pairs due to their different disposition positions, thereby preventing the issue of uneven brightness of the micro-LED display.

To make the above-mentioned features and advantages more comprehensible, several embodiments accompanied by drawings are described in detail as follows.

BRIEF DESCRIPTION OF THE DRAWINGS

The accompanying drawings are included to provide a further understanding of the disclosure, and are incorporated in and constitute a part of this specification. The drawings illustrate embodiments of the disclosure and, together with the description, serve to explain the principles of the disclosure.

DESCRIPTION OF THE EMBODIMENTS

Figure 1A:
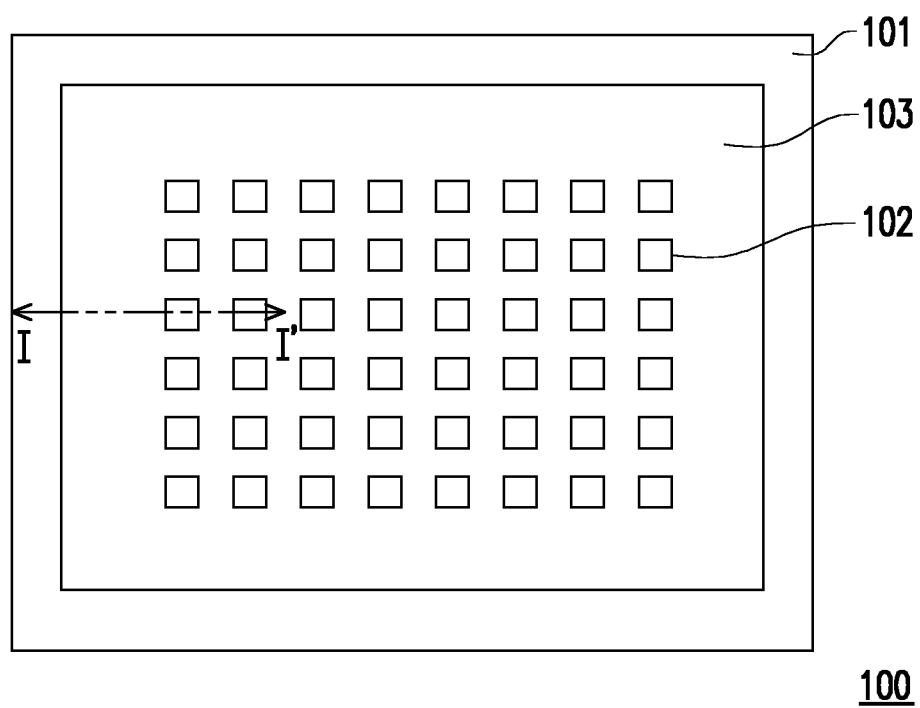
FIG. 1A shows a schematic plan view of a micro-LED display according to an embodiment of the disclosure.
Figure 1B:
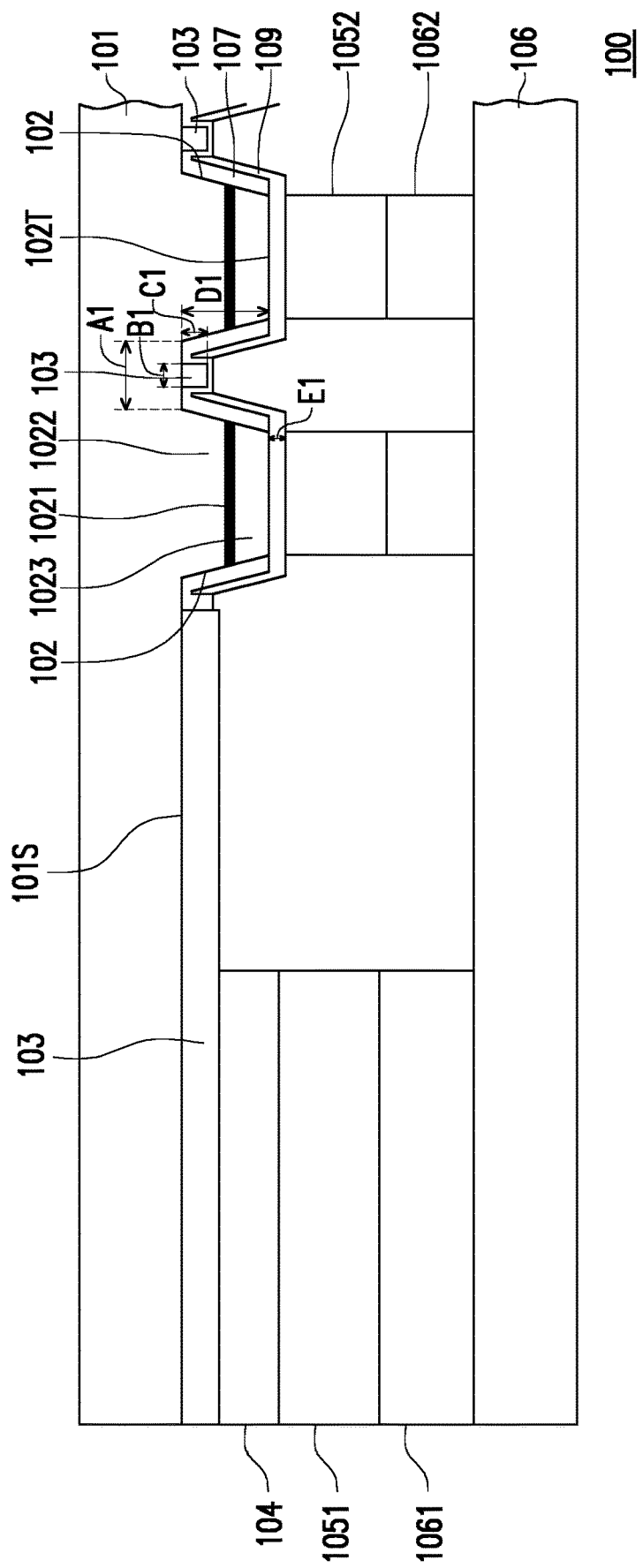
FIG. 1B shows a cross-sectional view of the micro-LED display in FIG. 1A taken along the line I-I'.

With reference to FIGS. 1A and 1B, FIG. 1A shows a schematic plan view of a micro-LED display 100 according to an embodiment of the disclosure, and FIG. 1B shows a cross-sectional view of the micro-LED display 100 in FIG. 1A taken along the line I-I'. The micro-LED display 100 includes a first type semiconductor base layer 101, a plurality of semiconductor light-emitting mesas 102, and a conducting layer 103. The plurality of semiconductor light-emitting mesas 102 are dispersedly disposed on the first type semiconductor base layer 101. The first type semiconductor base layer 101 has a surface 101S exposed by the semiconductor light-emitting mesas 102. The conducting layer 103 is disposed on the surface 101S of the first type semiconductor base layer 101 and is in an interlaced distribution configuration with the plurality of semiconductor light-emitting mesas 102. The ratio of the area of the conducting layer 103 in contact with the surface 101S to the area of the surface 101S is greater than or equal to 0.2.

Each of the semiconductor light-emitting mesas 102 includes an active layer 1021 (otherwise known as a light-emitting layer 1021), a first type semiconductor layer 1022, and a second type semiconductor layer 1023. The first type semiconductor layer 1022 is located between the second type semiconductor layer 1023 and the first type semiconductor base layer 101. The active layer 1021 is located between the first type semiconductor layer 1022 and the second type semiconductor layer 1023. An electrical polarity of the first type semiconductor layer 1022 is the same as an electrical polarity of the first type semiconductor base layer 101. An electrical polarity of the second type semiconductor layer 1023 is opposite to the electrical polarity of the first type semiconductor base layer 101.

According to an embodiment of the disclosure, the first type semiconductor base layer 101 is an N-type semiconductor, the first type semiconductor layer 1022 is an N-type semiconductor, the second type semiconductor layer 1023 is a P-type semiconductor, and the active layer 1021 is, for example, a multiple quantum well (MQW), but the disclosure is not limited thereto. In another embodiment of the disclosure, the first type semiconductor base layer 101 is a P-type semiconductor, the first type semiconductor layer 1022 is a P-type semiconductor, and the second type semiconductor layer 1023 is an N-type semiconductor.

In the embodiment shown in FIGS. 1A and 1B, the micro-LED display 100 further includes an electrode layer 104, a first bonding layer 1051, a second bonding layer 1052, a circuit substrate 106, a third bonding layer 1061, and a plurality of fourth bonding layers 1062. The circuit substrate 106 may be, for example, a complementary metal-oxide-semiconductor (CMOS) substrate, a liquid crystal on silicon (LCOS) substrate, or a thin-film transistor (TFT) substrate, or other substrates with a working circuit, but is not limited thereto. The bonding layers, e.g. the first bonding layer 1051, the second bonding layer 1052, the third bonding layer 1061, and the fourth bonding layers 1062, may be made of metal to increase conductive efficiency and light-emitting efficiency, but the invention is not limited thereto. In other embodiments, the bonding layers may be made of metal oxide material or any other nonmetal conductive material.

The micro-LED display 100 further includes a reflective layer 109. The reflective layer 109 is disposed on a side surface of the active layer 1021 and a side surface of the second type semiconductor layer 1023 to reflect light generated by the active layer 1021 and increase light extraction efficiency of the micro-LED display 100.

The micro-LED display 100 also includes an insulation layer 107. The insulation layer 107 is disposed between the side surface of the active layer 1021 and the reflective layer 109 to insulate the two. The insulation layer 107 is also disposed between the side surface of the second type semiconductor layer 1023 and the reflective layer 109 to insulate the two. The insulation layer 107 is also disposed between the conducting layer 103 and the reflective layer 109 to insulate the two. According to an embodiment of the disclosure, the material of the insulation layer 107 includes, for example, aluminum nitride or silicon dioxide, or the insulation layer 107 may be a distributed Bragg reflector (DBR), but the disclosure is not limited thereto.

It should be noted that in FIG. 1B, the reflective layer 109 is also disposed on a top surface 102T of each of the semiconductor light-emitting mesas 102, and between the second type semiconductor layer 1023 and the second bonding layer 1052. The reflective layer 109 includes a metal, which can increase the forward light emission. According to an embodiment of the disclosure, the material of the reflective layer 109 includes aluminum, titanium, silver, chromium, or a combination thereof, but the disclosure is not limited thereto. The second type semiconductor layer 1023, the reflective layer 109 and the second bonding layer 1052 are electrically connected to each other, but the disclosure is not limited thereto. In an embodiment of the disclosure, the reflective layer 109 inclusive of a metal is not disposed between the second type semiconductor layer 1023 and the second bonding layer 1052. The second-type semiconductor layer 1023 is in direct contact with and electrically connected to the second bonding layer 1052. In another embodiment of the disclosure, the reflective layer 109 does not include a metal, and is not disposed between the second type semiconductor layer 1023 and the second bonding layer 1052.

With reference to FIGS. 1A and 1B, the third bonding layer 1061 electrically connects the first bonding layer 1051 and the electrode layer 104 to the circuit substrate 106. The plurality of fourth bonding layers 1062 respectively electrically connect a plurality of second bonding layers 1052 to the circuit substrate 106. When a voltage is applied to the third bonding layer 1061 and the fourth bonding layer 1062 by the circuit substrate 106, the current generated by a potential difference between the third bonding layer 1061 and the fourth bonding layer 1062 enables the semiconductor light-emitting mesa 102 to emit a (visible) light beam.

Specifically, when the circuit substrate 106 applies the voltage to the third bonding layer 1061 and the fourth bonding layer 1062, there is a potential difference between the first type semiconductor layer 1022 and the second type semiconductor layer 1023 of the semiconductor light-emitting mesa 102, which causes recombination of the electron-hole pairs in the active layer 1021 to generate light. The light generated by the active layer 1021 is reflected by the reflective layer 109 to increase the light extraction efficiency of the micro-LED display 100. More specifically, it can be controlled by the active elements of the circuit substrate 106. For example, different voltages are respectively applied to the fourth bonding layers 1062 corresponding to the different semiconductor light-emitting mesas 102, causing the different semiconductor light-emitting mesas 102 to emit light beams of different intensities due to different potential differences, thereby displaying image information in an image frame of the micro-LED display 100.

It should be noted that, as mentioned above, the conducting layer 103 is disposed on the surface 101S of the first type semiconductor base layer 101, and the ratio of the area of the conducting layer 103 in contact with the surface 101S to the area of the surface 101S is greater than or equal to 0.2. If the ratio is less than 0.2, then the conductivity efficiency is insufficient. Preferably, the ratio is greater than or equal to 0.5 for better efficiency. Compared with using only the first type semiconductor base layer 101 as the common electrode, the conducting layer 103 has a lower resistance value. The current (or electron flow) from the circuit substrate 106 passing through the third bonding layer 1061, the first bonding layer 1051 and the electrode layer 104 will pass through the conducting layer 103 serving as the common electrode, to enable the plurality of semiconductor light-emitting mesas 102 of the micro-LED display 100, causing the active layer 1021 of the plurality of semiconductor light-emitting mesas 102 to emit light.

In contrast, in the related art, the first type semiconductor base layer 101 serves as the common electrode without the conducting layer 103. Since the resistance value of the first type semiconductor base layer 101 is higher, when a same voltage is applied to the fourth bonding layers 1062 corresponding to the different semiconductor light-emitting mesas 102, the semiconductor light-emitting mesas 102 that are farther away from the third bonding layer 1061 have fewer recombinations of the electron-hole pairs as compared with the semiconductor light-emitting mesa 102 that are closer to the third bonding layer 1061. This causes the luminous brightness of the semiconductor light-emitting mesas 102 that are farther away to be lower, resulting in the overall brightness of the micro-LED display 100 to be uneven.

The micro-LED display 100 according to the embodiment of the disclosure utilizes the characteristic that the resistance of the conducting layer 103 is less than the resistance of the first type semiconductor base layer 101. When the same voltage is applied to the fourth bonding layers 1062 corresponding to the different semiconductor light-emitting mesas 102, the semiconductor light-emitting mesas 102 that are farther away from the third bonding layer 1061 and the semiconductor light-emitting mesas 102 that are closer to the third bonding layer 1061 have an equal number of electron-hole pairs, therefore preventing the scenario of uneven brightness of the micro-LED display.

According to an embodiment of the disclosure, a thickness of the first type semiconductor layer 1022 is less than a thickness of the first type semiconductor base layer 101, so as to reduce impedance, but the disclosure is not limited thereto.

According to an embodiment of the disclosure, the material of the conducting layer 103 includes chromium, platinum, gold, aluminum, titanium, silicon, silver, graphene, metal oxides such as indium tin oxide, zinc oxide, indium zinc oxide, or a combination thereof, but the disclosure is not limited thereto.

With reference to FIGS. 1A and 1B again, in the micro-LED display 100, the different semiconductor light-emitting mesas 102 has a distance A1 between them, the conducting layer 103 disposed between the different semiconductor light-emitting mesas 102 has a breadth B1 and a thickness C1, each of the semiconductor light-emitting mesas 102 has a height D1, and the reflective layer 109 has a thickness E1. According to some embodiments of the disclosure, the distance A1 between the different semiconductor light-emitting mesas 102 is less than 20 μm. According to some embodiments of the disclosure, the breadth B1 of the conducting layer 103 is greater than 0.05 μm and is less than or equal to 10 μm, so as to prevent the conducting layer 103 from having a breadth that is too small, which results in poor conductivity. According to some embodiments of the disclosure, the height D1 of each of the semiconductor light-emitting mesas 102 is greater than the thickness C1 of the conducting layer 103, and the thickness C1 of the conducting layer 103 is greater than 0.01 μm and is less than or equal to 5 μm, so as to prevent the conducting layer 103 from having a thickness that is too small, which results in poor conductivity. According to some embodiments of the disclosure, the height D1 of each of the semiconductor light-emitting mesas 102 is greater than the thickness C1 of the conducting layer 103, and the height D1 of each of the semiconductor light-emitting mesas 102 is less than 5 μm. According to some embodiments of the disclosure, the thickness E1 of the reflective layer 109 is less than half of the distance A1 between the different semiconductor light-emitting mesas 102, and greater than 0.01 μm.

It must be noted here that the following embodiments continue to use the element numerals and part of the content of the foregoing embodiments. The same numerals are used to represent the same or similar elements, and description of the same technical content is omitted. Reference may be made to the foregoing embodiments for the description of the omitted parts, which will not be iterated in the following embodiments.

Figure 2A:
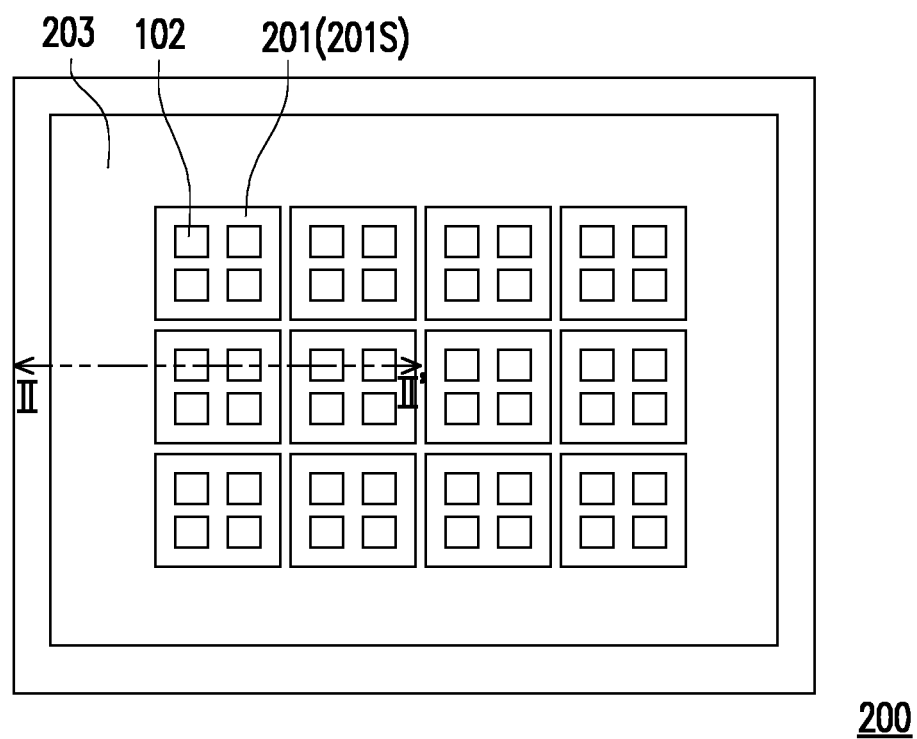
FIG. 2A shows a schematic plan view of a micro-LED display according to an embodiment of the disclosure.
Figure 2B:
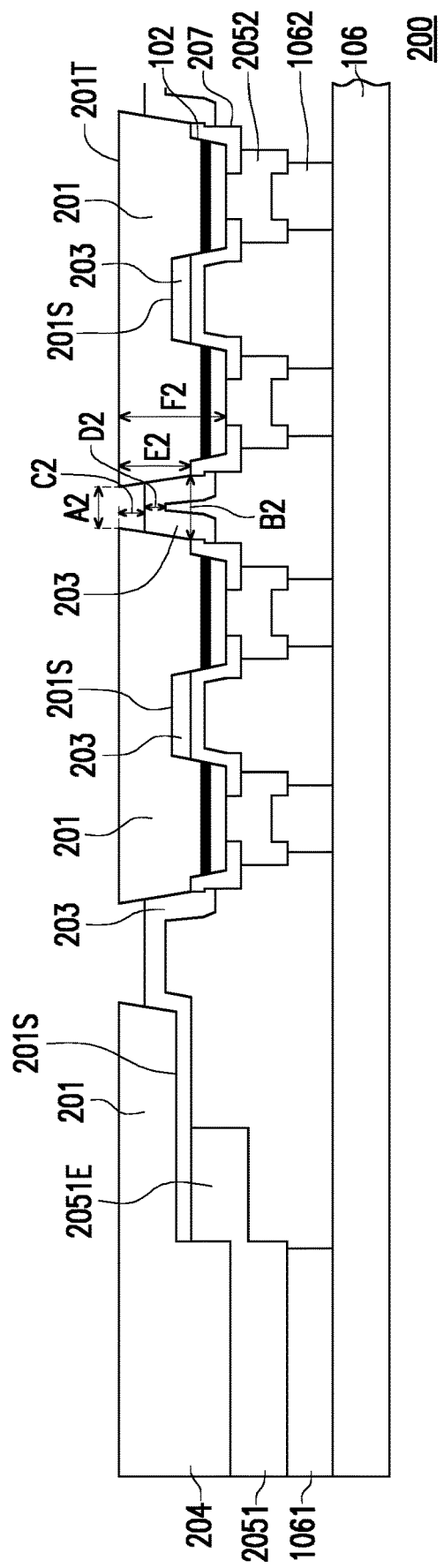
FIG. 2B shows a cross-sectional view of the micro-LED display in FIG. 2A taken along the line II-II'.

With reference to FIGS. 2A and 2B, FIG. 2A shows a schematic plan view of a micro-LED display 200 according to an embodiment of the disclosure, and FIG. 2B shows a cross-sectional view of the micro-LED display 200 taken along the line II-II'. The micro-LED display 200 includes a plurality of first type semiconductor base layers 201, a plurality of semiconductor light-emitting mesas 102, and a conducting layer 203. The plurality of semiconductor light-emitting mesas 102 are dispersedly disposed on the first type semiconductor base layers 201. The plurality of first type semiconductor base layers 201 have a surface 201S exposed by the semiconductor light-emitting mesas 102. The conducting layer 203 is disposed on the surface 201S of the first type semiconductor base layers 201 and is in an interlaced distribution configuration with the semiconductor light-emitting mesas. The ratio of an area of the conducting layer 203 in contact with the surface 201S to an area of the surface 201S is greater than or equal to 0.2.

In the embodiment, there are 4 semiconductor light-emitting mesas 102 disposed in a 2×2 matrix on each of the first type semiconductor base layers 201, but the disclosure is not limited thereto. In some embodiments, each of the first type semiconductor base layers 201 has 8 semiconductor light-emitting mesas 102 disposed in a 4×2 matrix. In other embodiments of the disclosure, there are m*n semiconductor light-emitting mesas 102 disposed in an m×n matrix on each of the first type semiconductor base layers 201, where m and n are positive integers. For illustrative purposes, in the following description, the plurality of semiconductor light-emitting mesas 102 on the same first type semiconductor base layer 201 are collectively referred to as a semiconductor light-emitting mesa group. In the embodiment shown in FIGS. 2A and 2B, each of the semiconductor light-emitting mesa groups includes four semiconductor light-emitting mesas 102.

The conducting layer 203 is further electrically connected to in-between the different first type semiconductor base layers 201 to form an ohmic contact to conduct current. Specifically, compared with the first type semiconductor base layer 101 in the embodiment shown in FIGS. 1A and 1B, the micro-LED display 200 of the embodiment has a plurality of discrete first type semiconductor base layers 201, and the plurality of discrete first type semiconductor base layers 201 are electrically connected to each other by the conducting layer 203. When considering that a sufficient contact area is required between the conducting layer 203 that is between the discrete first type semiconductor base layers 201 and the first type semiconductor base layers 201, a distance C2 between the conductive layer 203 and a light-emitting surface 201T of the first type semiconductor base layer 201 in a normal direction of the light-emitting surface 201T cannot be too large. When considering the process yield, the distance C2 cannot be too small too. According to an embodiment of the disclosure, the distance C2 is greater than 0.01 μm and is less than or equal to 5 μm, but the disclosure is not limited thereto.

The conducting layer 203 disposed between the different first type semiconductor base layers 201 may also be used to reflect the light emitted by the semiconductor light-emitting mesas 102. In other words, the conducting layer 203 disposed between the different first type semiconductor base layers 201 may also serve as a reflector, which reduces mutual influence between the light emitted by the semiconductor light-emitting mesas 102 on the different first-type semiconductor base layers 201. This prevents the scenario of optical crosstalk, and improves the luminous brightness and contrast of each of the semiconductor light-emitting mesa groups. In particular, the conducting layer 203 is disposed on a side surface of the first type semiconductor base layers 201 of each of the semiconductor light-emitting mesa groups, and increases the area in contact and the light extraction efficiency through the electrical connection on the side surface of the first type semiconductor base layers 201.

The micro-LED display 200 also has an insulation layer 207, which is disposed on a side surface and a part of a top surface of the semiconductor light-emitting mesas 102, and exposes a part of the top surface of the semiconductor light-emitting mesa 102 to bond to a second bonding layer 2052.

The micro-LED display 200 further includes a semiconductor bolster portion 204, and a first bonding layer 2051 disposed on the semiconductor bolster portion 204. The semiconductor bolster portion 204 is disposed on the first type semiconductor base layer 201. Specifically, the semiconductor bolster portion 204 may be manufactured by a process for manufacturing the semiconductor light-emitting mesa 102 and has a structure similar to that of the semiconductor light-emitting mesa 102. In the embodiment, the semiconductor light-emitting mesa 102 may be manufactured by, for example, an etching process, and the semiconductor bolster portion 204 is also formed by etching of the same process. The semiconductor bolster portion 204 may have a similar structure to that of the semiconductor light-emitting mesa 102, such as having a first type semiconductor layer, an active layer, and a second type semiconductor layer.

With reference to FIGS. 2A and 2B again, the third bonding layer 1061 electrically connects the first bonding layer 2051 and the semiconductor bolster portion 204 to the circuit substrate 106. The plurality of fourth bonding layers 1062 respectively electrically connect a plurality of second bonding layers 2052 to the circuit substrate 106. When a voltage is applied to the third bonding layer 1061 and the fourth bonding layer 1062 by the circuit substrate 106, the current generated by the potential difference between the third bonding layer 1061 and the fourth bonding layer 1062 enables the semiconductor light-emitting mesa 102 to emit a (visible) light beam.

It should be noted that in the embodiment, the first bonding layer 2051 includes an extending section 2051E, which extends to the conducting layer 203 via a side surface of the semiconductor bolster portion 204. Since the first bonding layer 2051 is electrically connected to the conducting layer 203 through its extending section 2051E, when a voltage is applied to the third bonding layer 1061 by the circuit substrate 106, the current (or electron flow) will flow from the circuit substrate 106 through the third bonding layer 1061 and the first bonding layer 2051 to reach the conducting layer 203, and then reach the plurality of discrete first type semiconductor base layers 201, but less pass through the semiconductor bolster portion 204. This is because the resistance value of the first bonding layer 2051 is less than the resistance value of the semiconductor bolster portion 204. From another perspective, when a voltage is applied to the third bonding layer 1061 by the circuit substrate 106, the voltage applied to the semiconductor bolster portion 204 is reversely biased, there will be no recombination of electrons and holes in the active layer of the semiconductor bolster portion 204, and therefore no light will be emitted. The semiconductor bolster portion 204 is a dummy semiconductor layer.

In the micro-LED display 200, the different first type semiconductor base layers 201 has a minimum distance A2 and a maximum distance B2 between them, the conducting layer 203 has a thickness D2, the first type semiconductor base layer 201 has a thickness E2, and the light-emitting surface 201T of the first type semiconductor base layer 201 and a distance between a top surface of a corresponding semiconductor light-emitting mesa in the normal direction of the light-emitting surface 201T is F2. According to some embodiments of the disclosure, the minimum distance A2 between the different first type semiconductor base layers 201 is greater than 0.01 µm. According to some embodiments of the disclosure, the maximum distance B2 between the different first type semiconductor base layers 201 is less than 10 µm. According to some embodiments of the disclosure, the maximum distance B2 between the different first type semiconductor base layers 201 is greater than the thickness D2 of the conducting layer 203, and the thickness D2 of the conducting layer 203 is greater than 0.01 µm. According to some embodiments of the disclosure, the thickness E2 of the first type semiconductor base layer 201 is greater than 0.01 µm. According to some embodiments of the disclosure, the distance F2 between the light-emitting surface 201T of the first type semiconductor base layer 201 and the top surface of the corresponding semiconductor light-emitting mesa in the normal direction of the light-emitting surface 201T is greater than 2 µm and less than 10 µm.

Figure 3:
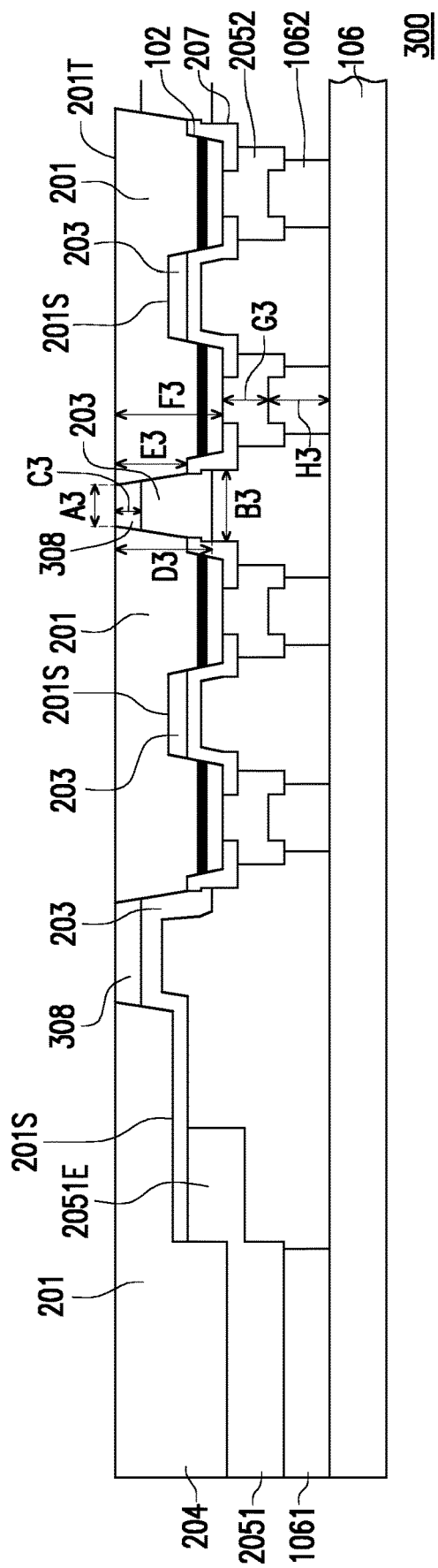
FIG. 3 shows a cross-sectional view of a micro-LED display according to an embodiment of the disclosure.

With reference to FIG. 3, FIG. 3 shows a cross-sectional view of a micro-LED display 300 according to an embodiment of the disclosure. Compared with the micro-LED display 200, the micro-LED display 300 further includes a filling layer 308, which is disposed between the light-emitting surface 201T and the conducting layer 203. Since each of the semiconductor light-emitting mesa groups is connected to the other groups only by the conducting layer 203, the filling layer 308 is added to increase the structural stability between each of the semiconductor light-emitting mesa groups. According to an embodiment of the disclosure, the filling layer 308 is an insulation layer, and its material includes organic polymers. According to another embodiment of the disclosure, the filling layer 308 includes a conductive material, in which the resistivity of the filling layer 308 may be less than the resistivity of the conducting layer 203. The filling layer 308 may also serve as a common electrode to increase conductivity.

In the micro-LED display 300, there is a minimum distance A3 and a maximum distance B3 between the different first type semiconductor base layers 201, and the filling layer 308 has a thickness C3. In addition, a top surface of the conducting layer 203 and the light-emitting surface 201T of the first type semiconductor base layer 201 has a distance D3 between them, the first type semiconductor base layer 201 has a thickness E3, and the light-emitting surface 201T of the first type semiconductor base layer 201 and a distance between the top surface of the corresponding semiconductor light-emitting mesa in the normal direction of the light-emitting surface 201T is F3. The second bonding layer 2052 has a thickness G3. The fourth bonding layer 1062 has a thickness H3. According to some embodiments of the disclosure, the minimum distance A3 between the different first type semiconductor base layers 201 is greater than 0.01 µm. According to some embodiments of the disclosure, the maximum distance B3 between the different first type semiconductor base layers 201 is less than 10 µm. According to some embodiments of the disclosure, the thickness C3 of the filling layer 308 is greater than 0.01 µm and less than 4 µm. According to some embodiments of the disclosure, the thickness E3 of the first type semiconductor base layer 201 is greater than 0.01 µm. According to some embodiments of the disclosure, the distance F3 between the light-emitting surface 201T of the first type semiconductor base layer 201 and the top surface of the corresponding semiconductor light-emitting mesa in the normal direction of the light-emitting surface 201T is greater than 2 µm and less than 10 µm. According to some embodiments of the disclosure, the thickness G3 of the second bonding layer 2052 is greater than 0.1 µm and less than 5 µm. According to some embodiments of the disclosure, the thickness H3 of the fourth bonding layer 1062 is greater than 0.1 µm and less than 5 µm.

Figure 4:
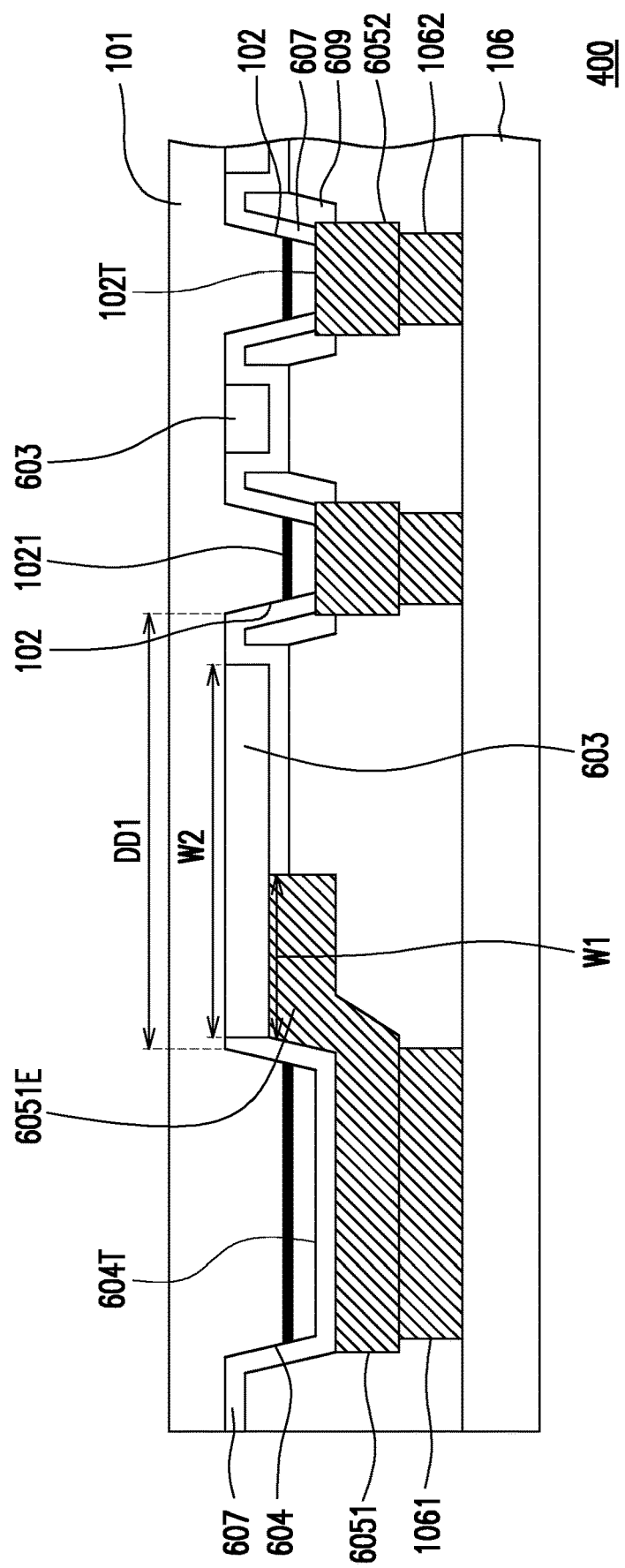
FIG. 4 shows a cross-sectional view of a micro-LED display according to an embodiment of the disclosure.

With reference to FIG. 4, FIG. 4 shows a cross-sectional view of a micro-LED display 400 according to an embodiment of the disclosure. The micro-LED display 400 includes the first type semiconductor base layer 101, a plurality of semiconductor light-emitting mesas 102, a semiconductor bolster portion 604, a first bonding layer 6051, a plurality of second bonding layers 6052, the circuit substrate 106, the third bonding layer 1061, a plurality of fourth bonding layers 1062, and a conducting layer 603.

The resistance of the conducting layer 603 is less than the resistance of the semiconductor bolster portion 604. The top surface 102T of each of the semiconductor light-emitting mesas 102 and a top surface 604T of the semiconductor bolster portion 604 are coplanar. In some embodiments of the disclosure, the semiconductor bolster portion 604 and each of the semiconductor light-emitting mesas 102 may be manufactured by the same manufacturing process and have similar structures.

An extending section 6051E of the first bonding layer 6051 is electrically connected to the first type semiconductor base layer 101 through the conducting layer 603. The material of the conducting layer 603 includes chromium, platinum, gold, aluminum, titanium, silicon, silver, a transparent conductive film such as indium tin oxide, or a combination thereof, but the disclosure is not limited thereto.

In an embodiment of the disclosure, a smallest distance between the semiconductor bolster portion 604 and a closest semiconductor light-emitting mesa 102 in a direction is DD1, the extending section 6051E of the first bonding layer 6051 has a breadth W1 in the direction, and the conducting layer 603 has a breadth W2 in the direction. The breadth W1 of the extending section 6051E is less than the breadth W2 of the conducting layer 603, the breadth W2 of the conducting layer 603 is less than the minimum distance DD1 between the semiconductor bolster portion 604 and the closest semiconductor light-emitting mesa 102, the breadth W1 of the extending section 6051E is greater than 0.1 µm, and the smallest distance DD1 between the semiconductor bolster portion 604 and the closest semiconductor light-emitting mesa 102 is less than 5 mm, but the disclosure is not limited thereto.

In the embodiment shown in FIG. 4, the micro-LED display 400 further includes an insulation layer 607 and a plurality of reflective metal layers 609. The plurality of reflective metal layers 609 are respectively disposed on the side surface of the plurality of semiconductor light-emitting mesas 102. Each of the reflective metal layers 609 is disposed to reflect a light beam emitted by the light-emitting layer 1021 of a corresponding semiconductor light-emitting mesa 102. This is to increase the amount of light emitted from the display surface of the micro-LED display 400 and prevent occurrence of the scenario of optical crosstalk in the light beams emitted by the light-emitting layers 1021 of the different semiconductor light-emitting mesas 102. The insulation layer 607 is disposed between each of reflective metal layers 609 and the corresponding semiconductor light-emitting mesa 102 to insulate the reflective metal layer 609 from the semiconductor light-emitting mesa 102, so as to prevent occurrence of a short circuit between the reflective metal layer 609 and the semiconductor light-emitting mesa 102. The material of the reflective metal layer 609 may include a conductive material such as aluminum, titanium, silver, chromium, and so on, but the disclosure is not limited thereto.

In summary, in the micro-LED display provided by the embodiments of the disclosure, the conducting layer is in contact with the first type semiconductor base layer, the conducting layer serves as the common electrode, and the characteristic that the resistance of the conducting layer is less than the resistance of the first type semiconductor base layer is being utilized. This causes the different micro-LEDs to not have inconsistent numbers of electron-hole pairs due to their different disposition positions, thereby preventing the issue of uneven brightness of the micro-LED display.

It will be apparent to those skilled in the art that various modifications and variations can be made to the structure of the invention without departing from the scope or spirit of the invention. In view of the foregoing, it is intended that the invention covers modifications and variations of this invention provided they fall within the scope of the following claims and their equivalents.

What is claimed is:

1. A micro light-emitting diode (micro-LED) display, comprising:
    at least one first type semiconductor base layer;
    a plurality of semiconductor light-emitting mesas, dispersedly disposed on the at least one first type semiconductor base layer, wherein the at least one first type semiconductor base layer has a surface exposed by the plurality of semiconductor light-emitting mesas; and
    a conducting layer, disposed on the surface of the at least one first type semiconductor base layer and in an interlaced distribution configuration with the semiconductor light-emitting mesas, and a ratio of an area of the conducting layer in contact with the surface to an area of the surface is greater than or equal to 0.2.

2. The micro-LED display according to claim 1, wherein each of the semiconductor light-emitting mesas comprises:
    a first type semiconductor layer;
    a second type semiconductor layer, wherein the first type semiconductor layer is located between the second type semiconductor layer and the at least one first type semiconductor base layer; and
    an active layer, located between the first type semiconductor layer and the second type semiconductor layer.

3. The micro-LED display according to claim 2, wherein a thickness of the at least one first type semiconductor base layer is greater than a thickness of the first type semiconductor layer.

4. The micro-LED display according to claim 2, further comprising:
    a reflective layer, wherein the reflective layer is disposed on a side surface of the active layer and a side surface of the second type semiconductor layer; and
    an insulation layer, wherein the insulation layer is disposed between the side surface of the active layer and the reflective layer and between the side surface of the second type semiconductor layer, and the reflective layer and the reflective layer.

5. The micro-LED display according to claim 4, wherein the insulation layer is further disposed between the conducting layer and the reflective layer.

6. The micro-LED display according to claim 4, wherein the reflective layer comprises a metal, and the reflective layer is further disposed on a first top surface of each of the semiconductor light-emitting mesas facing away from the at least one first type semiconductor base layer.

7. The micro-LED display according to claim 1, wherein the conducting layer is further electrically connected to in-between two first type semiconductor base layers in the at least one first type semiconductor base layer.

8. The micro-LED display according to claim 7, wherein a distance between the conducting layer and a light-emitting surface of the at least one first type semiconductor base layer in a normal direction of the light-emitting surface is greater than 0.01 μm and is less than or equal to 5 μm.

9. The micro-LED display according to claim 8, further comprising a filling layer disposed between the light-emitting surface and the conducting layer.

10. The micro-LED display according to claim 9, wherein the filling layer is composed of an insulation material.

11. The micro-LED display according to claim 9, wherein the filling layer is composed of a conductive material, and a resistance of the filling layer is less than a resistance of the conducting layer.

12. The micro-LED display according to claim 1, wherein a thickness of the conducting layer is greater than 0.01 μm and is less than or equal to 5 μm.

13. The micro-LED display according to claim 1, wherein a breadth of the conducting layer in a region between the semiconductor light-emitting mesas is greater than 0.05 μm and is less than or equal to 10 μm.

14. The micro-LED display according to claim 1, further comprising:
   a bolster portion, disposed on the at least one first type semiconductor base layer, wherein a first top surface of the bolster portion facing away from the at least one first type semiconductor base layer and a second top surface of each of the semiconductor light-emitting mesas facing away from the at least one first type semiconductor base layer are coplanar;
   a first bonding layer, disposed on the first top surface; and
   a plurality of second bonding layers, respectively disposed on a plurality of second top surfaces.

15. The micro-LED display according to claim 14, wherein a resistance of the conducting layer is less than a resistance of the bolster portion.

* * * * *